United States Patent [19]

Yamada et al.

[11] Patent Number: 4,757,581

[45] Date of Patent: Jul. 19, 1988

[54] METHOD FOR PRODUCING A PIEZOELECTRIC RESONATOR

[75] Inventors: Sumio Yamada; Yoshiro Fujiwara, both of Kawasaki; Yuji Kojima, Chigasaki; Hiroshi Hoshino, Kawasaki, all of Japan

[73] Assignee: Fujitsu Limited, Kawasaki, Japan

[21] Appl. No.: 938,457

[22] Filed: Dec. 5, 1986

Related U.S. Application Data

[60] Division of Ser. No. 815,657, Dec. 30, 1985, abandoned, which is a continuation of Ser. No. 654,044, Sep. 24, 1984, abandoned, which is a continuation of Ser. No. 486,690, Apr. 20, 1983, abandoned.

[30] Foreign Application Priority Data

Apr. 20, 1982 [JP] Japan .............................. 57-065947
Apr. 28, 1982 [JP] Japan .............................. 57-072451

[51] Int. Cl.⁴ ............................................. H01L 41/08
[52] U.S. Cl. ..................................... 29/25.35; 29/840; 310/348; 310/365; 310/368
[58] Field of Search ............... 29/25.35, 840; 310/344, 310/348, 351–356, 365–368

[56] References Cited

U.S. PATENT DOCUMENTS 3,073,975  1/1963  Bigler et al. ..................... 310/348 X
4,012,648  3/1977  Engdahl .......................... 29/25.35 X

FOREIGN PATENT DOCUMENTS 57-118419  7/1982  Japan ................................. 29/25.35

Primary Examiner—Carl E. Hall
Attorney, Agent, or Firm—Staas & Halsey

[57] ABSTRACT

A piezoelectric resonator includes a base plate and a strip-type, energy trapping piezoelectric resonator chip mounted on the base plate. The piezoelectric resonator chip includes a piezoelectric chip plate and a pair of electrode patterns formed on the opposed main surfaces of the piezoelectric chip plate. One main surface of the piezoelectric chip plate faces the base plate and is parallel therewith, and a conductive layer is formed on each end of the main surface facing the base plate. The thickness of the conductive layer is greater than that of the electrode pattern so that the electrode pattern is separated from the base plate. The conductive layer is directly mounted onto a conductive portion of the base plate, so as to electrically connect the electrode pattern and the conductive portion of the base plate.

9 Claims, 10 Drawing Sheets

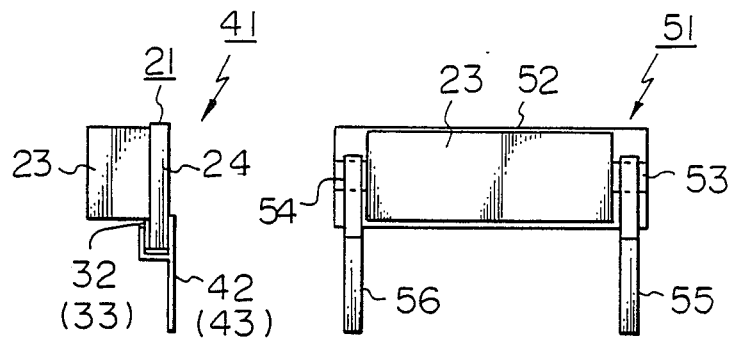
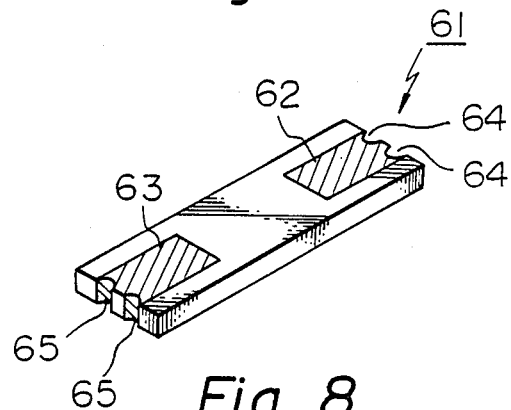
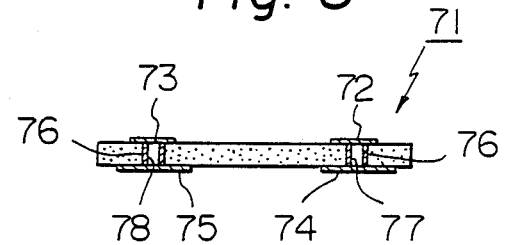

METHOD FOR PRODUCING A PIEZOELECTRIC RESONATOR

This application is a divisional application of copending U.S. application Ser. No. 815,657, filed Dec. 30, 1985; abandoned, which is a continuation of U.S. application No. 654,044, filed Sept. 24, 1984, now abandoned; which is a continuation of U.S. application No. 486,690, filed Apr. 20, 1983, now abandoned.

BACKGROUND OF THE INVENTION (1) Field of the Invention

The present invention relates to a strip-type piezoelectric resonator comprising a piezoelectric material such as lithium tantalate ($LiTaO_3$) or the like and to a method for producing the same.

(2) Description of the Prior Art

Piezoelectric resonators comprise a plate of piezoelectric material, such as crystal or lithium tantalate, and a pair of electrode films coated on the upper and lower main surfaces of the plate. When an alternating current (a.c.) electric field is applied between the electrode films, the piezoelectric plate is subject to stress of a frequency equal to that of the a.c. electric field. When the frequency of the a.c. electric field coincides with the inherent resonance frequency of the piezoelectric plate, electric resonance occurs, resulting in greater oscillation of the piezoelectric chip. Oscillating devices comprising such piezoelectric resonators are widely used in oscillators or filters of communication apparatuses because of their compactness, high reliability and high stability of the oscillation frequency.

A prior art strip-type piezoelectric resonator comprising a resonator chip of a single crystal of $LiTaO_3$ is illustrated in FIG. 1. The resonator 1 comprises an energy trapping-type piezoelectric resonator chip 4 housed in a cap 6 which is secured to a base 5. The piezoelectric resonator chip 4 comprises a strip-shaped chip plate 2 having a rectangular cross section and a pair of T-shaped electrode patterns 3 and 3' formed on the opposed two main surfaces (the front surface and the rear surface in the drawing) by an evaporation method. The piezoelectric resonator chip 4 is supported by a pair of support wires 7 and 7' which are secured to lead terminals 8 and 8', respectively. The lead terminals 8 and 8' are secured to the base 5.

The piezoelectric resonator of the prior art is high, and the support member for the resonator chip does not withstand vibration well. Also, assembly of the parts of the piezoelectric resonator of the prior art is troublesome. In order to decrease the height of the resonator, it has been proposed to fold the lead terminal 13, illustrated in FIG. 2, after the resonator 11 is mounted on a printed board 12. However, such an arrangement requires a large amount of space on the printed board.

SUMMARY OF THE INVENTION

An object of the present invention is to provide a piezoelectric resonator in which the above-mentioned drawbacks are obviated.

A piezoelectric resonator according to the present invention comprises a base plate and a strip-type, energy trapping piezoelectric resonator chip mounted on the base plate. The piezoelectric resonator chip comprises a piezoelectric chip plate and a pair of electrode patterns formed on the opposed main surfaces of the piezoelectric chip plate. One main surface of the piezoelectric chip plate faces the base plate and is parallel therewith. A conductive layer is formed on each end of the main surface facing the base plate. The thickness of the conductive layer is greater than that of the electrode pattern, so that the electrode patterns are separated from the base plate. The conductive layer is directly mounted on a conductive portion of the base plate so as to electrically connect the electrode patterns and the conductive portion of the base plate.

BRIEF DESCRIPTION OF THE DRAWINGS

FIG. 5 is a side view of a piezoelectric resonator having lead terminals according to the present invention;

FIG. 6 is a front view of another piezoelectric resonator having lead terminals according to the present invention;

FIG. 7 is a perspective view of a base plate of a piezoelectric resonator according to the present invention;

FIG. 8 is a sectional view of another base plate of a piezoelectric resonator according to the present invention;

DESCRIPTION OF THE PREFERRED EMBODIMENTS

Figure 3:
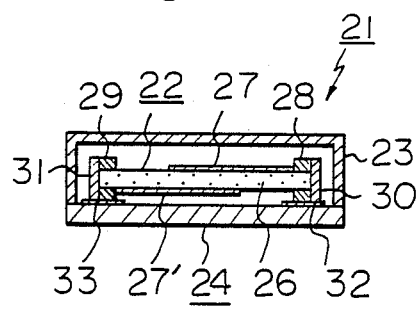
FIG. 3 is a sectional view of a piezoelectric resonator according to the present invention.
Figure 4:
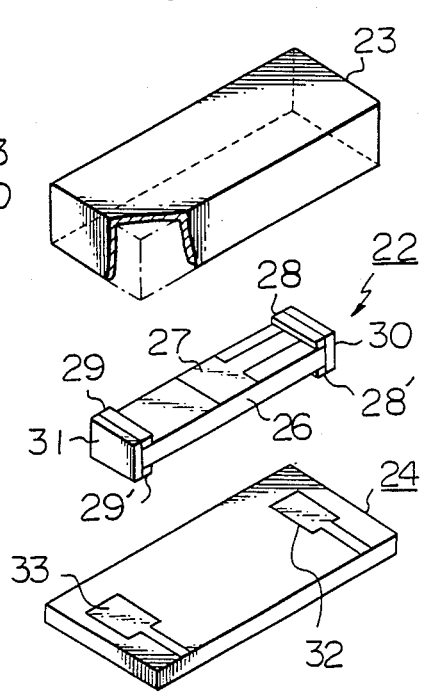
FIG. 4 is a disassembled view of the piezoelectric resonator of FIG. 3.

A piezoelectric resonator which generates thickness shear oscillation is illustrated in FIGS. 3 and 4. The piezoelectric resonator 21 comprises a piezoelectric resonator chip 22, a cap 23 of ceramic or the like, and a base plate 24 of ceramic or the like. The piezoelectric resonator chip 22 comprises a piezoelectric chip plate 26 and a pair of T-shaped electrode patterns 27 and 27' formed on the opposed two main surfaces (the upper and lower surfaces) of the piezoelectric chip plate 26. A pair of electrode terminals 28 and 28' of conductive thick films is formed on the upper and lower surfaces of the piezoelectric chip plate 26 at one end thereof. Also, a pair of electrode terminals 29 and 29' of conductive thick films is formed on the upper and lower surfaces of the piezoelectric chip plate 26 at the other end thereof. The electrode terminals 28 and 28' are electrically connected to each other by a conductive film 30, and the electrode terminals 29 and 29' are electrically connected to each other with a conductive film 31. A pair of conductive film layers 32 and 33 is formed on the upper surface of the base plate 24. The electrode terminals 28' and 29' are placed on the pair of conductive film layers 32 and 33 of the base plate 24 so that the electrode terminal 28' is electrically connected to the conductive film layer 32 and the electrode terminal 29' is electrically connected to the conductive film layer 33. The thickness of the electrode terminals 28' and 29' is greater than that of the electrode pattern 27', so that the electrode pattern 27' does not contact the base plate 24 when the resonator chip 22 is mounted on the base plate 24.

The electrode terminals 28, 29, 28', and 29' are formed by printing and curing a silver paste. The thickness of the electrode terminals 28 and 29 and the combined thickness of the electrode terminal 28' and the conductive film layers 32 is about 30% to 45% of the thickness of the piezoelectric chip plate 26. In such an arrangement, the quality factor Q of the resonator is upgraded and the generation of unnecessary spurious oscillation is effectively suppressed. The process for connecting the electrode terminals 28' and 29' and the conductive film layers 32 and 33, is conducted simultaneously with the process for forming the conductive films 30 and 31 so as to increase the production efficiency.

In order to obtain a stable characteristic of the resonator irrespective of a change of circumferential temperature, it is desirable to select the material of the parts so that the coefficient of heat expansion of the piezoelectric chip plate 26 is approximately the same as that of the base plate 24. Also, it is desirable that the coefficient of heat expansion of the conductive adhesion paste for combining the piezoelectric chip plate 26 and the base plate 24 be the same as that of the piezoelectric chip plate 26 or the base plate 24.

Figure 1:
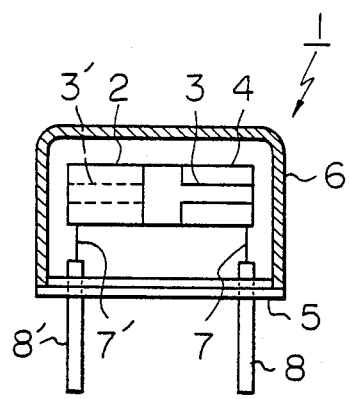
FIG. 1 is a partial sectional side view of a piezoelectric resonator of the prior art.
Figure 2:
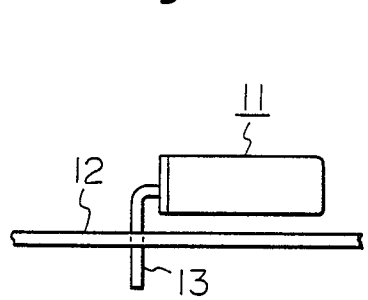
FIG. 2 is a side view of another piezoelectric resonator of the prior art in which the lead terminals are folded.

In FIG. 5, a piezoelectric resonator having a pair of lead terminals is illustrated. A resonator device 41 comprises a piezoelectric resonator 21 and a pair of lead terminals 42 and (43) (only one of the lead terminals is illustrated). The fork-shaped end of each lead terminal holds the base plate 24. Each of the lead terminals 42 and (43) is electrically connected to one of the conductive film layers 32 and (33) which extend out of the cap 23. The height of the resonator device 41 is low compared to the resonator 1 of FIG. 1 since the support wires 7 and 7' in FIG. 1 are omitted and the chip plate 26 is disposed in parallel with the base plate 24.

In FIG. 6, a piezoelectric resonator 51 comprises a resonator chip housed within a cap 23 and a ceramic base plate 52. Conductive film layers 53 and 54, which are similar to the conductive film layers 32 and 33, are formed on the base plate 52. The conductive film layers 53 and 54 extend out of the cap 23 on the longitudinal ends of the base plate 52. A pair of fork-like lead terminals 55 and 56, which are similar to the lead terminals 42 and 43, are attached to both longitudinal ends of the base plate 52 so that each lead terminal is electrically connected to the conductive film layer exposed on that end. In this arrangement, the height of the resonator is further decreased as compared with the arrangement of FIG. 5.

In FIG. 7, a base plate 61, on which a resonator chip and a cap are mounted, is illustrated. A pair of conductive film layers 62 and 63 is formed on the upper surface of the base plate 61. Also, a pair of conductive film layers is formed on the lower surface of the base plate 61. The upper and the lower conductive film layers are connected by conductive layers 64 and 65 which are coated on the inner surface of grooves formed at the longitudinal side ends of the base plate 61. A piezoelectric chip (not shown) is mounted on the pair of conductive film layers 63 and 62. A piezoelectric resonator of such a construction and without lead terminals is directly mounted on a printed board of a hybrid circuit so that the resonator is electrically connected to the circuit through the conductive film layers of the lower surface of the base plate.

In FIG. 8, a base plate 71 on which a resonator chip and a cap are mounted, is illustrated. A pair of conductive film layers 72 and 73 is formed on the upper surface of the base plate 71. Also, a pair of conductive film layers 74 and 75 is formed on the lower surface of the base plate 71. The upper and the lower conductive film layers are connected through conductive layers 77 and 78 coated on the inner surface of through holes 76. A piezoelectric resonator comprising a resonator chip mounted on the base plate 71 is directly mounted on a printed board of a hybrid circuit so that the resonator is electrically connected to the circuit through the lower conductive film layers 74 and 75.

Figure 9:
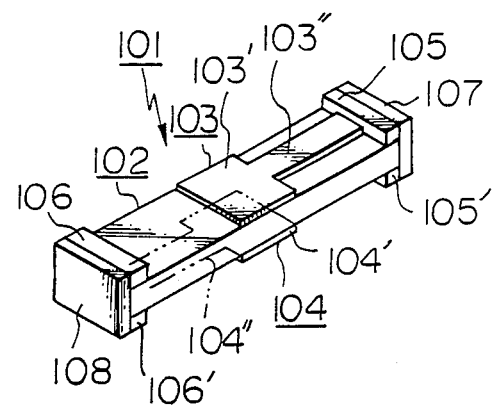
FIG. 9 is a perspective view of a piezoelectric resonator chip of the present invention.
Figure 10:
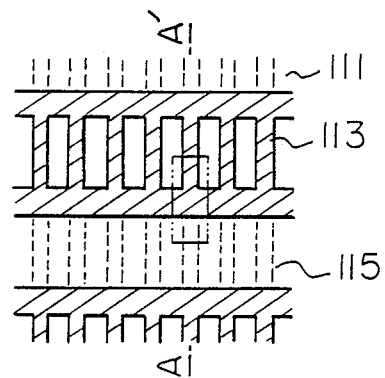
FIGS. 10 to 13 are partial plan views of a substrate on which a piezoelectric resonator chip is mounted, each figure showing a different production process of the present invention.

In FIG. 9, a resonator chip 101 comprises a piezoelectric chip plate 102 of $LiTaO_3$ and a pair of T-shaped electrode patterns 103 and 104 formed on the opposed main surfaces (the upper and lower surfaces) of the piezoelectric chip plate 102. The electrode patterns 103 and 104, respectively, comprise electrode main portions 103' and 104' and connecting portions 103" and 104" extending from the main portions 103' and 104' toward an end of the piezoelectric chip plate 102. A pair of electrode terminals 105 and 105' of a conductive thick film, connected through a conductive film 107, is formed on the upper and the lower surfaces of the piezoelectric chip plate 102 at one end thereof. Also, a pair of electrode terminals 106 and 106' connected through a conductive film 108 is, formed at the other end of the piezoelectric chip plate 102.

A method of producing the piezoelectric resonator chip of FIG. 9 is described with reference to FIGS. 10 to 18.

Figure 14:
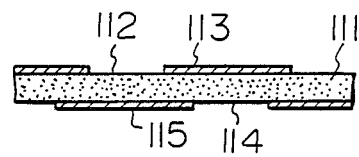
FIG. 14 is a sectional view along the line A—A' of FIG. 10.

Ladder-shaped electrode films 113 (FIG. 10) are formed at predetermined intervals on one main surface 112 (the upper surface in FIG. 14) of the wafer 111 by an evaporation method. Similarly, ladder-shaped electrode films 115 are formed on the other main surface 114 (the lower surface in FIG. 14) of the wafer 111. The upper and the lower electrode films 113 and 115 are alternately disposed, as is illustrated in FIG. 14, so that the longitudinal connecting portion for the steps of the upper ladder is superposed on the connecting portion for the steps of the lower ladder through the wafer 111. Each chip is formed at a position indicated by the dash-dot rectangle in FIG. 10.

Figure 11:
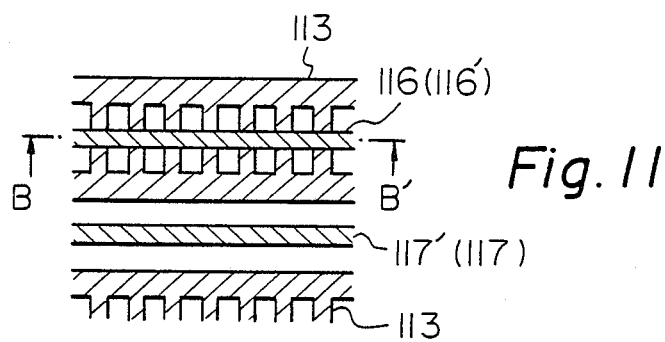
Figure 15:
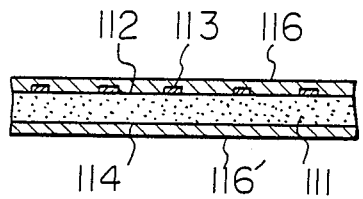
FIG. 15 is a sectional view along the line B—B' in FIG. 11.
Figure 16:
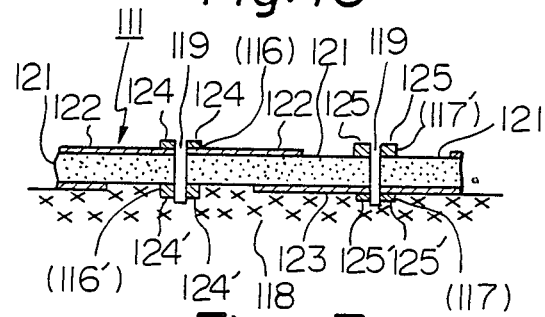
FIGS. 16 and 17 are sectional views along the line C—C' of FIG. 12, each figure showing a different production process of the present invention.

Then, as is illustrated in FIGS. 11 and 15, longitudinal conductive layers 116 and 116' are formed by a screen printing method on the upper and the lower main surfaces 112 and 114, respectively, facing each other through the wafer 111. The upper conductive layer 116 crosses the center of each of the ladder-shaped electrode films 113. Simultaneously, longitudinal conductive layers 117' and 117 are formed on the upper and the lower main surfaces 112 and 114. The lower conductive layer 117 crosses the center of each of the ladder-shaped electrode films 115 which are formed on the lower surface of the wafer 111.

Then the wafer 111 is disposed on an expansible adhesive dicing tape 118 (FIG. 16) so that the lower main surface 114 of the wafer 111 adheres to the dicing tape 118. The dicing tape 118 is held by a conventional tape support (not shown).

Figure 12:
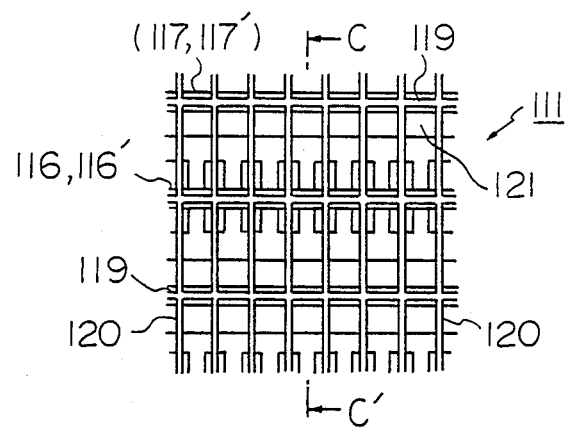

The diced wafer 111 is illustrated in FIG. 12. Each of the conductive layers 116, 116', 117, and 117' is longitudinally cut with an appropriate cutting means so that each cut groove 119 is formed along and on each conductive layer 116, 116', 117, and 117'. Also, cut grooves 120 perpendicular to the cut grooves 119 are formed, cutting the center of the connecting portion of the ladder-shaped electrode films 113 and 115 between adjacent steps. The wafer 111 diced in the above manner comprises a plurality of piezoelectric chip plates 121, each piezoelectric chip plate 121 being defined by two adjacent pairs of cut grooves 119 and 120 and corresponding to the piezoelectric chip plate 102 of FIG. 9. The ladder-shaped electrode films 113 and 115 are separated so that electrode patterns 122 and 123, (FIG. 16) which correspond to the electrode patterns 103 and 104 of FIG. 9, are formed on the upper and the lower surfaces of each chip plate 121. Each of the conductive layers 116, 116', 117, and 117' is separated so that conductive layers 124, 124', 125, and 125', which correspond to the electrode terminals 105, 105', 106, and 106' of FIG. 9, are formed at the ends of each chip plate 121.

The cutting means which cuts the wafer 111 comprises, e.g., a disc blade having diamonds embedded therein and forms cut grooves 119 and 120 of about 0.1 mm in width.

Figure 17:
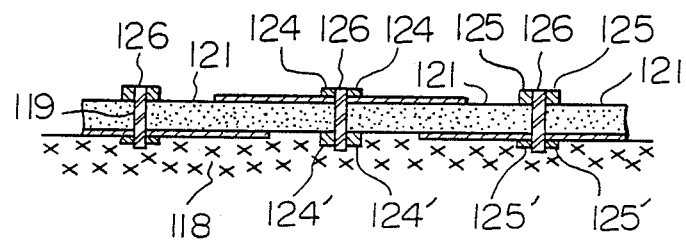

After the cut grooves 119 and 120 are formed on the wafer 111, a conductive paste 126 is filled in the cut grooves 119, as is illustrated in FIG. 17, by a screen printing method using a flat metal mask. It is desirable that the viscosity of the conductive paste be between 20,000 CPS and 40,000 CPS. If the viscosity is more than 40,000 CPS, the conductive paste cannot be introduced into the cut groove. If the viscosity is less than 20,000 CPS, the conductive paste spreads over the wafer.

Figure 13:
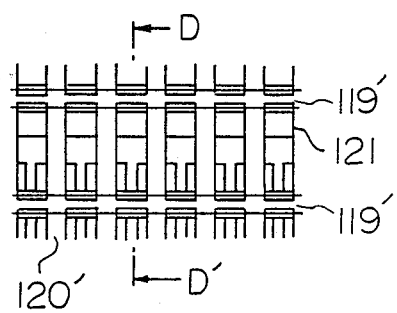
Figure 18:
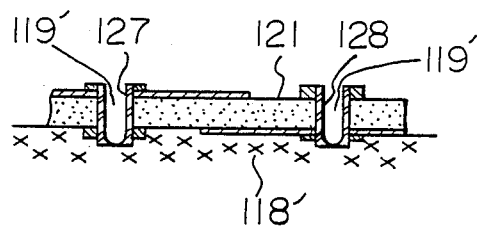
FIG. 18 is a sectional view along the line D—D' in FIG. 13.

Then the tape 118 is heated and expanded so that the width of the cut grooves 119 and 120 between the chip plates 121 is widened, as is illustrated in FIGS. 13 and 18. The conductive paste filled in the groove 119 is separated and covers the separated inner surfaces of the widened groove 119', so that conductive films 127 and 128, which correspond to the conductive films 107 and 108 of FIG. 9, are formed at the ends of the chip plate 121.

Next, each chip plate 121 which constitutes a piezoelectric resonator chip is removed from the expanded tape 118'. Then the conductive films 127 and 128 are dried. The conductive films 127 and 128 may be dried during the process of expanding the dicing tape or during the process of removing the chip plates from the dicing tape so as to decrease the number of production processes of the resonator chip.

An example of a method of production of a piezoelectric resonator according to the present invention is described hereinafter with reference to FIGS. 19 and 22 to 25.

Figure 19:
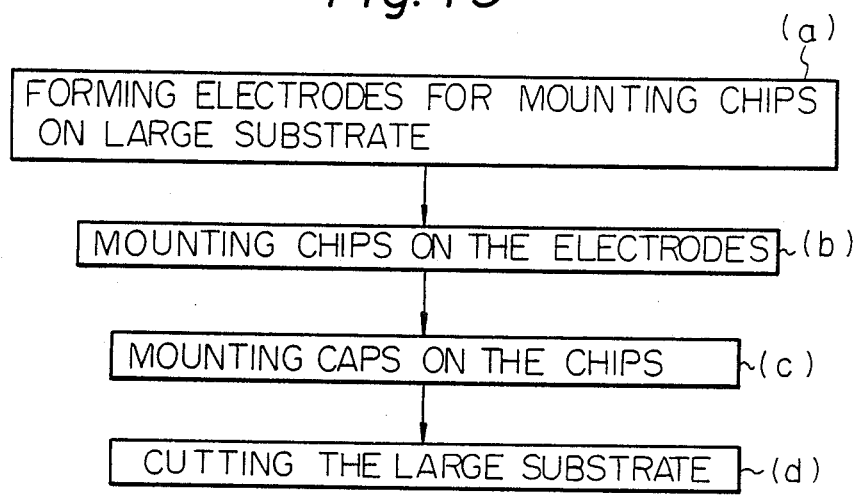
FIG. 19 is a flow chart of a production method of the present invention.
Figure 22:
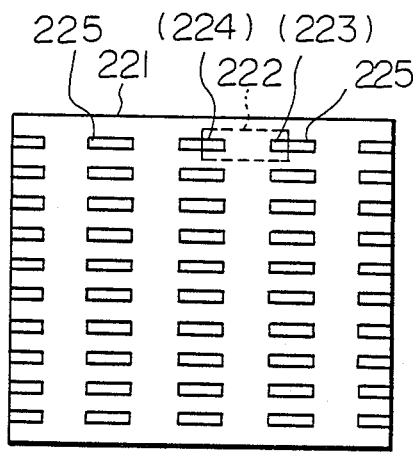
FIGS. 22 to 24 are partial plan views of a substrate on which a piezoelectric resonator chip is mounted, each figure showing a different production process of the production method of FIG. 19.

The first step (a) of the flow chart of FIG. 19 is to form a plurality of electrodes on a large substrate on which chips are mounted. As is illustrated in FIG. 22, a plurality of electrode films 225 are formed on a large ceramic substrate 221 in a matrix arrangement. A base plate 222, which corresponds to the base plate 24 of FIG. 3, is cut from the substrate 221, as is illustrated by the dashed rectangle in FIG. 22. Forty base plates 222 can be obtained from the substrate 221 of this particular example.

Figure 23:
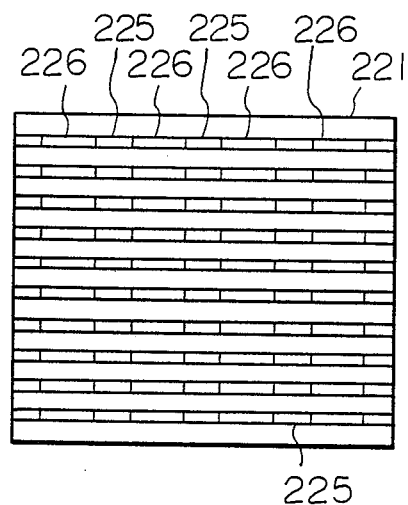

The second step (b) of the flow chart of FIG. 19 is to mount the chips on the electrodes. As is illustrated in FIG. 23, a plurality of resonator chips 226 are mounted on the substrate 221, each of the chips 226 corresponding to the resonator chip 22 of FIG. 3 and being mounted on and between the ends 223 and 224 (FIG. 22) of two adjacent electrode films 225. The resonator chip 226 comprises two electrode patterns which correspond to the electrode patterns 27 and 27' of FIG. 3, electrode terminals which correspond to the electrode terminals 28, 28', 29 and 29' of FIG. 4, and conductive layers which correspond to the conductive films 30 and 31 of FIG. 3. However, these parts of the electrode are not illustrated in the drawing.

Figure 24:
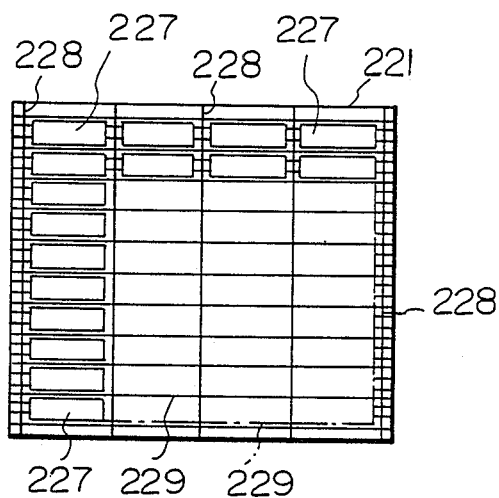

The third step (c) of the flow chart of FIG. 19 is to mount caps on the resonator chips attached to the substrate 221. As is illustrated in FIG. 24, each ceramic cap 227 is disposed on a resonator chip 226 (FIG. 23). The cap 227 is bonded to the substrate 221 with an insulating adhesive agent such as an epoxy resin so that the resonator chip 226 is enclosed within the cap 227.

Figure 25:
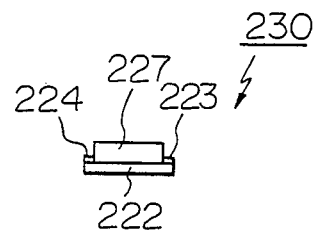
FIG. 25 is a side view of a piezoelectric resonator produced by the method of FIG. 19.

The fourth step (d) of the flow chart of FIG. 19 is to cut the large substrate. Longitudinal slits 229 and lateral slits 228 are formed by irradiating the substrate with a laser beam. The substrate 221 is cut along the slits 228 and 229 and divided into individual piezoelectric resonators 230 which comprise a base plate 222 and a cap 227 in which a resonator chip is enclosed, as is illustrated in FIG. 25.

Another example of the method of production of a piezoelectric resonator according to the present invention is described hereinafter with reference to FIGS. 20 and 26 to 29.

Figure 20:
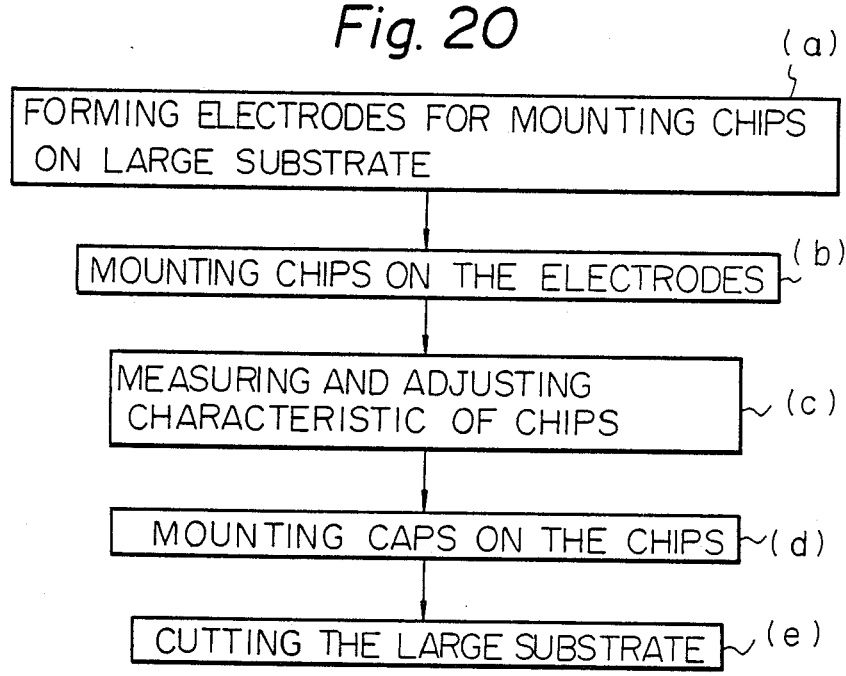
FIG. 20 is a flow chart of another production method of the present invention.
Figure 26:
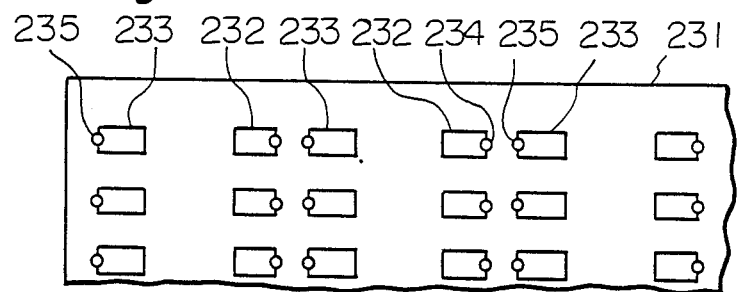
FIGS. 26 to 28 are partial plan views of a substrate on which a piezoelectric resonator chip is mounted, each figure showing a different production process of the production method of FIG. 20.

The first step (a) of the flow chart of FIG. 20 is to form a plurality of electrodes on a large substrate on which resonator chips are mounted. As is illustrated in FIG. 26, a plurality of electrode films 232 and 233 are disposed in a matrix arrangement on a large ceramic substrate 231 which corresponds to the substrate 221 of FIG. 22. A through hole 234 or 235 is formed at an end of the electrode films 232 and 233. The size of each electrode film is such that the tip of a test probe (described later) can contact the electrode film. The electrode films 232 and 233 are appropriately separated from each other. An electrode film corresponding to each of the electrode films 232 and 233 is formed on the rear side of the substrate 231. The electrode film formed on the rear side of the substrate is electrically connected to the electrode film 232 or 233 formed on the upper surface of the substrate through the through hole 234 or 235.

Figure 27:
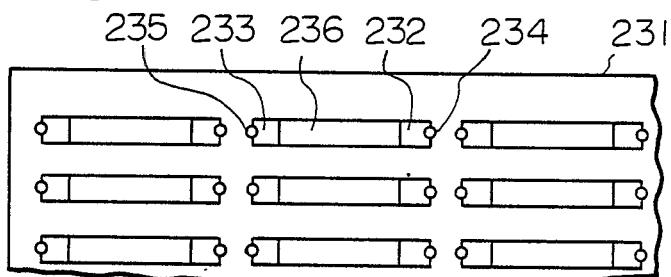
Figure 28:
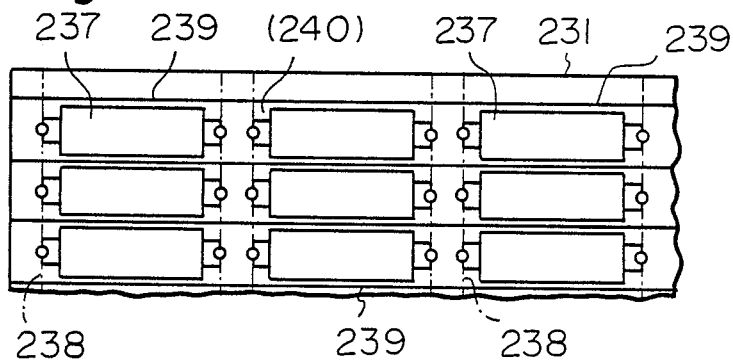

The second step (b) of the flow chart of FIG. 20 is to mount resonator chips on the electrode films formed on the substrate. A plurality of resonator chips 236, each chip corresponding to the resonator chip 22 of FIG. 3 is mounted on the substrate 231, as are illustrated in FIG. 27. Each resonator chip 236 is mounted on and between the two adjacent electrode films 232 and 233.

The third step (c) of the flow chart of FIG. 20 is to measure and adjust the characteristic of the resonator chips mounted on the substrate. In this adjustment process, a test probe contacts each of the electrode films 232 and 233 connected to the resonator chips mounted on the substrate in a batch so as to measure and adjust the frequency of the individual resonator chips in succession.

The fourth step (d) of the flow chart of FIG. 20 is to mount caps on the resonator chips. Each ceramic cap 237 (FIG. 28) is bonded to the substrate 231 with an insulating adhesive agent so that each resonator chip 236 is enclosed within the cap 237.

Figure 29:
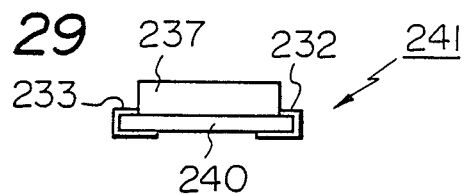
FIG. 29 is a side view of a piezoelectric resonator produced by the method of FIG. 20.

The fifth step (e) of the flow chart of FIG. 20 is to cut the large substrate. Longitudinal slits 239 and lateral slits 238 are formed on the substrate 231 by irradiating the substrate with a laser beam. The lateral slits 238 divide the through holes 234 and 235. The large substrate 231 is cut along the slits 238 and 239 and is divided into a plurality of piezoelectric resonators 241 each resonator comprising a base plate 240 and a resonator chip 236 mounted on the electrode films 232 and 233 and enclosed within the cap 237, as is illustrated in FIG. 29.

A further example of the method of production of a piezoelectric resonator according to the present invention is described hereinafter with reference to FIGS. 21 and 30 to 33.

Figure 21:
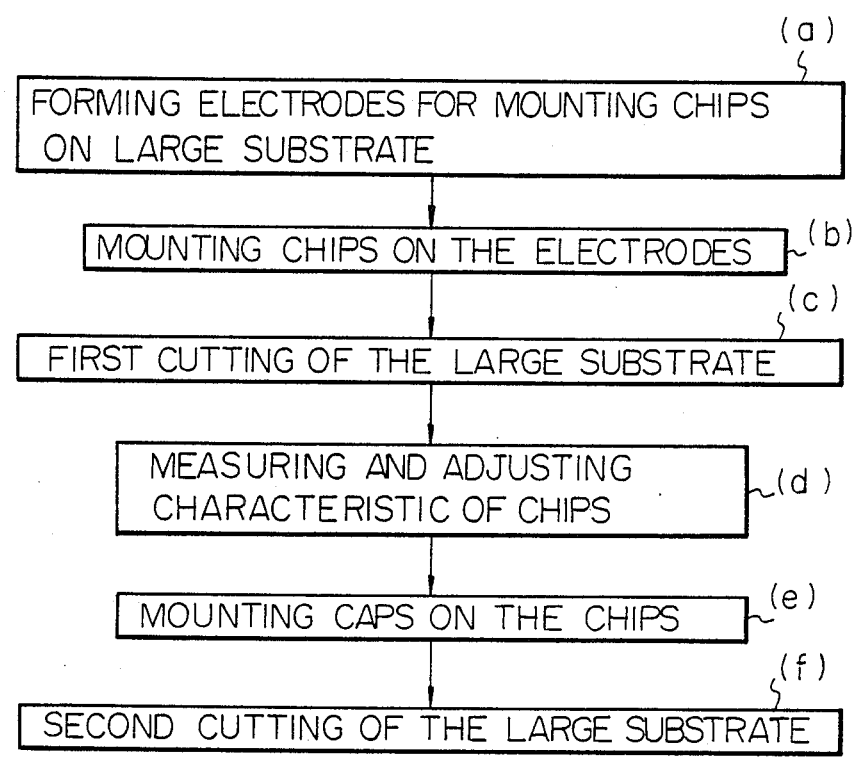
FIG. 21 is a flow chart of a further production method of the present invention.
Figure 30:
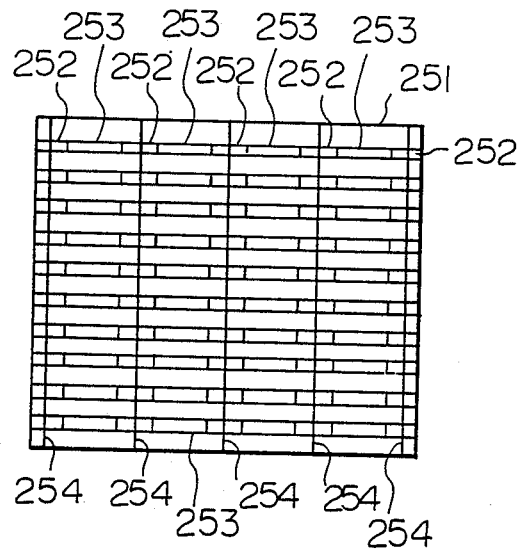
FIGS. 30 to 32 are partial plan views of a substrate on which a piezoelectric resonator chip is mounted, each figure showing a different production process of the production method of FIG. 21.

The first step (a) of the flow chart of FIG. 21 is to form electrodes on a large substrate on which chips are mounted. A plurality of electrode films 252 similar to the electrode films 225 of FIG. 22 are formed on a large ceramic substrate 251, as is illustrated in FIG. 30. The size of each electrode film 252 is such that the tip of a test probe for measuring and adjusting the characteristic of the resonator chip can contact the electrode film 252.

The second step (b) of the flow chart of FIG. 21 is to mount chips on the substrate. Each resonator chip 253, which corresponds to the resonator chip 22 of FIG. 3, is disposed on and between the ends of two adjacent electrode films 252, as is illustrated in FIG. 30.

The third step (c) of the flow chart of FIG. 21 is to conduct a first cutting of the substrate 251 along lateral slits 254 which are formed by irradiating the substrate with a laser beam and to divide each electrode film 252 at the center thereof, as is illustrated in FIG. 30.

Figure 31:
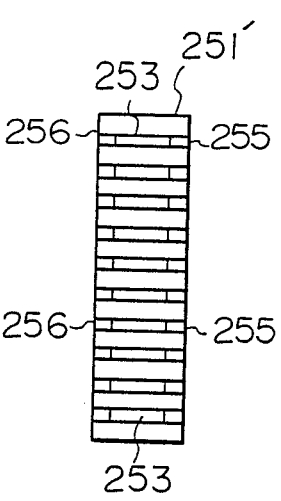
Figure 32:
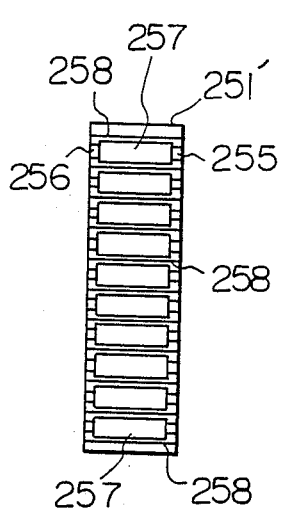

The fourth step (d) of the flow chart of FIG. 21 is to measure and adjust the characteristic of the chips mounted on the substrate. A plurality (ten in this particular example) of resonator chips 253 is disposed side by side on a laterally divided substrate 251', as is illustrated in FIG. 31. The substrate 251' is secured to a test device (not shown). The tip of a test probe (not shown) contacts each of the electrode films 255 and 256, in succession, the electrode films 255 and 256 having been separated from the electrode films 252 in the previous process, so as to measure and adjust the frequency of the resonator chips 253. The adjustment step (d) of FIG. 21 is similar to the process (c) of FIG. 20. However, in the method of FIG. 21, the probe is moved only in one direction, while in the method of FIG. 20, the probe must be moved in two directions perpendicular to each other since the resonator chips are adjusted before the substrate is divided, as is illustrated in FIG. 27. Also, scraps of the substrate are not formed in the process (c) of cutting the substrate of FIG. 21 since the electrode films 255 and 256 to be sepatated from the substrate are integrally formed as one electrode film 252 on the substrate 251 while in the cutting process (d) of FIG. 19, scraps of the substrate between two adjacent slits 238 (FIG. 28) are formed.

The fifth step (e) of the flow chart of FIG. 21 is to mount caps on the resonator chips. Each ceramic cap 257 is bonded to the divided substrate 251' with an insulating adhesive agent, as is ilustrated in FIG. 32.

Figure 33:
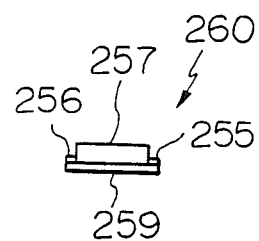
FIG. 33 is a side view of a piezoelectric resonator produced by the method of FIG. 21.

The sixth step (f) of the flow chart of FIG. 21 is to conduct a second cutting of the substrate. Slits 258 (FIG. 32) are formed along the caps 257 on the divided substrate 251' by irradiating the substrate with a laser beam. Then the substrate 251' is cut along the slits 258 and is divided into a plurality of piezoelectric resonators 260, each resonator comprising a base plate 259, a resonator chip mounted on the electrode films 255 and 256 on the base plate 259, and a cap 257, as is illustrated in FIG. 33.

As was mentioned above, a piezoelectric resonator according to the present invention has a low height since the resonator chip is directly mounted on the base plate of the resonator. Furthermore, according to the present invention, resonators can be rapidly mass produced at a low cost since a plurality of resonators in a batch can be simultaneously manufactured from a wafer and a large substrate.

Also, the characteristic of the resonators is not degraded during the electrode forming process, as is the case in the prior art, since the electrodes of a plurality of resonator chips of the present invention are simultaneously produced in a batch.

The production efficiency and productivity of piezoelectric resonators are enhanced by simultaneously measuring and adjusting the frequency of a batch of resonator chips and by simultaneously assembling a batch of resonator chips and the base plates, using a large substrate which is divided into a plurality of base plates.

We claim:

1. A method for mass-producing piezoelectric resonator chips from a wafer, said method comprising the steps of:
(a) forming an electrode pattern on upper and lower surfaces of the wafer, the electrode pattern comprising a strip-like first segment and a plurality of tooth-like second segments projecting perpendicularly from one side of the first segment, the first and second segments forming a comb-shape, the first segments on the upper and lower surfaces of the wafer facing each other through the wafer, and a projection direction of the second segments with respect to the first segment on the upper surface being opposite that of the second segments on the lower surface of the wafer; and (b) cutting the wafer into a plurality of rectangular parallelpiped chips having an upper main surface and a lower main surface, a longitudinal direction of the chip being the projection direction of the second segments, and the first segments being transversely located at a center of each chip.

2. A method according to claim 1, wherein said step (b) further includes cutting the wafer so that each chip has a pair of T-shaped electrode patterns respectively formed on opposite main surfaces of the piezoelectric resonator chip, each of the T-shaped electrode patterns having a narrow elongated portion extending from a longitudinal end of the chip and an enlarged portion formed at an end of the elongated portion and extending across the entire width of the chip,.

3. A method according to claim 1, further comprising a step (c) including mounting each chip on a base plate having conductive portions and having a flat upper surface, a flat lower surface, and side surfaces, the conductive portions being disposed directly on both of the upper and lower surfaces of the base plate and being electrically connected together through one of the side surfaces of the base plate, each chip being mounted on the upper surface of the base plate.

4. A method according to claim 3, wherein said step (b) further includes cutting the wafer so that each chip has a pair of T-shaped electrode patterns respectively formed on opposite main surfaces of the piezoelectric resonator chip, each of the T-shaped electrode patterns having a narrow elongated portion extending from a longitudinal end of the chip and an enlarged portion formed at an end of the elongated portion and extending across the entire width of the chip, one of the main surfaces of the piezoelectric chip facing the base plate in a direction parallel thereto.

5. A method according to claim 3, further comprising the substeps of:

(i) forming conductive layers on each end of both of the main surfaces of the piezoelectric resonator chip before said step (c);

(ii) forming a conductive film at each end of the side surfaces before said step (c); and (iii) connecting together the conductive layers on each main surface through the conductive film, the conductive layer being formed directly on the conductor portions, facing the base plate and being operatively connected to the pair of T-shaped electrode patterns, for electrically connecting the pair of T-shaped electrode patterns and the conductive portions, the thickness of the conductive layer being greater than that of the pair of T-shaped electrode patterns.

6. A method according to claim 5, further comprising a step (d) of attaching a cap to the upper surface of the base plate on which the piezoelectric resonator chip is mounted for enclosing the piezoelectric resonator chip.

7. A method according to claim 5, wherein the chip, the conductive layer, and the base plate each have approximately the same temperature expansion coefficient.

8. A method according to claim 5, further comprising a step (d) of forming at least one groove on at least one of the side surfaces of the base plate, wherein the at least one groove has the conductive layer formed thereon, and wherein the conductive portions on the upper and lower surfaces of the base plate are electrically connected together through the at least one groove coated with the conductive layer.

9. A method according to claim 8, wherein the groove has a semi-cylindrical shape.

* * * * *

UNITED STATES PATENT AND TRADEMARK OFFICE
CERTIFICATE OF CORRECTION

PATENT NO. : 4,757,581
DATED : JULY 19, 1988
INVENTOR(S) : SUMIO YAMADA ET AL.

It is certified that error appears in the above-identified patent and that said Letters Patent is hereby corrected as shown below:

Col. 2, line 40, "in" should be --of--.

Col. 4, line 8, "33," should be --(33),--;
      line 13, "43," should be --(43),--;
      line 62, "108 is," should be --108, is--.

Col. 5, line 14, "method- on" should be --method on--;
      line 43, "123, (FIG. 16)" should be --123 (FIG. 16),--;

Col. 7, line 14, "3 is" should be --3, are--.

Col. 8, line 16, "sepatated" should be --separated--;
      line 24, "ilustrated" should be --illustrated--.

Col. 9, line 18, "chip,." should be --chip.--.

Signed and Sealed this

Sixth Day of December, 1988

Attest:

DONALD J. QUIGG

Attesting Officer      Commissioner of Patents and Trademarks